US008489962B2

(12) United States Patent
Dielissen

(10) Patent No.: US 8,489,962 B2
(45) Date of Patent: Jul. 16, 2013

(54) SHUFFLED LDPC DECODING

(75) Inventor: John Dielissen, Nederweert (NL)

(73) Assignee: ST-Ericsson SA, Plan-les-Ouates (CH)

( * ) Notice: Subject to any disclaimer, the term of this patent is extended or adjusted under 35 U.S.C. 154(b) by 685 days.

(21) Appl. No.: 12/452,412

(22) PCT Filed: Jul. 1, 2008

(86) PCT No.: PCT/IB2008/052635

§ 371 (c)(1),
(2), (4) Date: Jun. 7, 2010

(87) PCT Pub. No.: WO2009/004572

PCT Pub. Date: Jan. 8, 2009

(65) Prior Publication Data

US 2010/0251059 A1    Sep. 30, 2010

(30) Foreign Application Priority Data

Jul. 4, 2007  (EP) .................................... 07111728

(51) Int. Cl.
*H03M 13/116*       (2006.01)
(52) U.S. Cl.
USPC ............................ 714/758; 715/752; 715/754
(58) Field of Classification Search
USPC .......................................... 714/754, 752, 758
See application file for complete search history.

(56) References Cited

U.S. PATENT DOCUMENTS 7,093,179 B2 *  8/2006  Shea .............................. 714/755
(Continued)

FOREIGN PATENT DOCUMENTS

| EP | 1 521 372 A1 | 4/2005 |
| EP | 1 622 276 A2 | 2/2006 |
| EP | 1 696 574 A1 | 8/2006 |

OTHER PUBLICATIONS

International Search Report dated Nov. 7, 2008 in connection with PCT Patent Application No. PCT/IB2008/052635.
John Dielissen, et al., "Non-fractional parallelism in LDPC Decoder implementations", IEEE Conference on Design, Automation & Test in Europe, Apr. 16, 2007, 6 pages.
John Dielissen, et al., "Low cost LDPC decoder for DVB-S2", IEEE Conference on Design, Automation and Test in Europe, Munich, Germany, vol. 2, Mar. 6, 2006, 6 pages.
Frederic Guilloud, "Generic Architecture for LDPC Codes Decoding", Jul. 2004, 200 pages.
Hayashi, et al. "Design and Implementation of a new DVB-S2 modem for SNG applications." IEICE Technical Report; Dec. 13, 2007; pp. 13-19; vol. 107 No. 401; The Institute of Electronics, Information and Communication Engineers, Tokyo, Japan.

(Continued)

*Primary Examiner* — Joseph Schell
(74) *Attorney, Agent, or Firm* — Coats & Bennett, P.L.L.C.

(57) ABSTRACT

An LDPC decoder iteratively decodes an LDPC code represented by a parity check matrix H consisting of a plurality of circulants based on a Log-Likelihood Ratio Belief-Propagation algorithm. First computation means (1010) compute for a next iteration symbol messages $\lambda_{\kappa m}$ from a representation of a corresponding symbol value stored in a first memory 1005 and from check node messages $\Lambda_{mn}$ from a previous iteration. A shuffler (1030) changes a sequence of the symbol message received from the first computation means (1010) in dependence on a position of the non-zero elements in a corresponding sub-matrix. Second computation means (DP-O, DP-I, DP-D-I) compute the check node messages in dependence on symbol messages received from the barrel shifter and store a representation of the computed check node message in a second memory (1015). Third computation means (1020) update the representation of the symbol values in the first memory in dependence on output of the first and second computing means. The principle of "staggered" or "shuffled" LDPC decoding is used. One embodiment is designed for multi-diagonal circulants.

8 Claims, 9 Drawing Sheets

U.S. PATENT DOCUMENTS

| | | | |
|---|---|---|---|
| 7,415,079 B2* | 8/2008 | Cameron et al. | 375/340 |
| 7,587,659 B2* | 9/2009 | Tran et al. | 714/794 |
| 8,151,161 B2* | 4/2012 | Cho et al. | 714/752 |
| 8,176,383 B2* | 5/2012 | Song et al. | 714/758 |
| 8,201,047 B2* | 6/2012 | Sakai et al. | 714/755 |
| 8,250,449 B2* | 8/2012 | Wang | 714/794 |
| 8,351,541 B2* | 1/2013 | Taylor et al. | 375/295 |
| 2005/0138519 A1 | 6/2005 | Boutillon et al. | |
| 2010/0287437 A1* | 11/2010 | Dore et al. | 714/752 |

OTHER PUBLICATIONS

3rd Generation Partnership Project. "Comparison between Turbo and LDPC codes under the condition of parallel operation." 3PGG TSG RAN SG1 Meeting #44, R1-060526, Denver, USA, Feb. 13-17, 2006.

* cited by examiner

_US 8,489,962 B2_

SHUFFLED LDPC DECODING

CROSS-REFERENCE TO RELATED APPLICATION(S)

The present application claims priority under 35 U.S.C. §365 to International Patent Application No. PCT/IB2008/052635 filed Jul. 1, 2008, entitled "SHUFFLED LDPC DECODING". International Patent Application No. PCT/IB2008/052635 claims priority under 35 U.S.C. §365 and/or 35 U.S.C. §119(a) to European Patent Application No. 07111728.7 filed Jul. 4, 2007 and which are incorporated herein by reference into the present disclosure as if fully set forth herein.

FIELD OF THE INVENTION

The invention relates to an LDPC decoder and LDPC decoding method.

BACKGROUND OF THE INVENTION

In a transmission between a source and a receiver, some transmission errors may occur. Error correcting codes can be used to detect and correct some of these errors. Low-Density Parity-Check (LDPC) Codes are a class of error correcting code: they are block codes (or equivalently parity-check codes) and are defined by a parity-check matrix H. They were introduced in 1963 by R. G. Gallager (in Gallager's Thesis, "Low-Density Parity-Check Codes", 1963, MIT) in the case of LDPC codes over the Galois Field GF(2). The principle was generalized by Mackay in 1998 (in D. J. C Mackay, M. C. Davey, "Low Density Check Code over GF(q)", Cavendish Laboratory, Cambridge, United Kingdom, 1998) over a Galois Field of higher cardinality, i.e. $GF(r^q)$ where r is a prime number. LDPC codes can be used in a variety of transmission systems, e.g. satellite communications, wireless transmissions, fiber optics, and a variety of storage media e.g. hard disk drive, optical disk, magnetic band. Examples of systems that use LDPC are DVB-S2, DMB-T (Chinese DVB Terrestrial standard), STiMi (Chinese DVB satellite standard), IEEE 802.11n and 802.16e.

An LDPC code is defined by a parity-check matrix H of size M rows by N columns, M being the number of constraints (corresponding check nodes) and N being the number of variables (estimated values of symbols of the code, represented by symbol nodes). A non-zero entry of the matrix at position (m,n) indicates that the variable $v_n$ participates in the constraint $c_m$. Most newly standardized systems use a parity check matrix that is subdivided in blocks (matrices), called circulants. A circulant is either a zero-matrix (all elements 0) or based on an identity matrix. The circulants that are based on the identity matrix may be single diagonal (either the identity matrix itself or a rotated version of the identity matrix) or may have multiple diagonals. A so-called barrel shifter is used to rotate the variables, which are usually stored in the normal sequential sequence in a memory) to a position that is defined by rotation of the identity matrix. A state-of-the art, low-cost implementation is published in J. Dielissen et. al. "Low cost LDPC decoder for DVB-S2", in IEEE Proceedings of DATE, 2006, hereinafter [Dielissen, DATE]. However, this architecture cannot solve LDPC codes containing "multiple diagonals". Processing of multiple diagonals is clearly more complicated. US2005/0138519 A1 shows an architecture designed for dealing with multi-diagonal circulants. However, this architecture is not scalable towards cheap instantiations which do not need to solve the "multiple diagonals".

SUMMARY OF THE INVENTION

It would be advantageous to provide an LDPC decoding architecture that is scalable, preferably can be used for several standardized systems with either single or multi-diagonal circulants. It would also be advantageous to reduce costs of the known LDPC decoding architectures.

To better address this concern, in a first aspect of the invention, the LDPC decoder is for iteratively decoding an LDPC code on a Galois Field where the code is represented by a predetermined M×N parity check matrix H consisting of a plurality of sub-matrices where each sub-matrix is either a zero-matrix or a matrix with a same number of non-zero elements in each row and column; the LDPC decoder being based on a Log-Likelihood Ratio Belief-Propagation algorithm, hereinafter referred to a LLR-BP algorithm, representing passing symbol messages $\lambda_{nm}$ from a respective symbol-node n (0<=n<N) to a connected check-node m (0<=m<M) and passing check node messages $\Lambda_{mn}$ from a respective check-node m to a connected symbol-node n; connections between symbol nodes and check nodes being defined by the parity check matrix H; the LDPC decoder including:

a first memory (1005) for storing for each symbol node a representation of a respective symbol value of a corresponding symbol of the LDPC code;

a second memory (1015) for storing a representation of the respective check node messages $\Lambda_{mn}$;

first computation means (1010) for computing for a next iteration symbol messages $\lambda_{nm}$ from the representation of a corresponding symbol value stored in the first memory and check node messages from a previous iteration;

a shuffler (1030) for receiving from the first computation means 1010 symbol messages arranged in a first sequence and supplying the symbol message in a different sequence in dependence on a position of the non-zero elements in a corresponding sub-matrix;

second computation means (DP-0, DP-1, DP-D-1) for computing, in accordance with the LLR-BP algorithm, check node messages and for storing a representation of the computed check node messages in the second memory; the computation being in dependence on symbol messages received from the barrel shifter by the respective check node; and third computation means (1020) for updating the representation of the symbol values in the first memory in dependence on output of the first and second computing means.

In the architecture according to the invention, the symbol message (frequently referred to as the $\lambda_{nm}$ message) is calculated in the linear domain (i.e. before the shuffler), contrary to prior art solutions where this calculation is carried out in the shuffled domain. This makes it possible without major redesign to produce an encoder suitable for single or multi-diagonal systems. Moreover, it enables cost-reduction. As described in the dependent claim 6, the sub-matrix may be a circulant, and the shuffler implemented as a barrel shifter.

In an embodiment according to the invention, at least one of the sub-matrices is a matrix with at least two non-zero elements in each row and column, hereinafter referred to as multi-matrix; the first computation means being arranged to compute symbol messages $\lambda_{nm}^i$ that correspond to a multi-matrix in dependence on associated check node messages that each correspond to a respective one of the non-zero elements in the multi-matrix.

By operating in the linear domain, dealing with such sub-matrices with multiple non-zero elements (e.g. multi-diagonals) is simplified. As described in the dependent claim 3, such multi-matrices can be handled in a simple iterative structure, where each time information from one associated check node message is combined with the intermediate result.

In an embodiment according to the invention, the LLR-BP algorithm is based on a min-sum algorithm and the LDPC encoder including correcting means for multiplying a value of a symbol message by a corrective factor α; and saturation means for restricting a value to a predetermined range; the correcting means and saturating means being arranged in between the first computation means and the barrel shifter. By performing the correction and saturation before the barrel shifter, the barrels shifter operates on a more restricted value range and can thus be implemented cheaper.

In an embodiment according to the invention, the representation of the symbol messages is stored in the first memory in a predetermined sequence; the LDPC decoder including a further barrel shifter arranged in between the second computation means and third computation means for supplying check node messages in a sequence corresponding to said predetermined sequence. The architecture may also include a further barrel shifter in the reverse path (i.e. towards the first memory). This simplifies control of the barrel shifter in the forward path.

In an embodiment according to the invention, the LLR-BP algorithm is based on a min-sum algorithm; the second computation means including compression means for compressing check node messages and storing the check node messages in the second memory in a compressed form; and the first computation means including decompression means for decompressing check node messages read from the second memory. By storing the check node messages in a compressed form, costs are reduced. The architecture according to the invention can operate with both compressed as well as decompressed check node messages.

To meet an object of the invention, a method of iteratively decoding an LDPC code on a Galois Field is presented where the code is represented by a predetermined M×N parity check matrix H consisting of a plurality of circulants, where each circulants is either a zero-matrix or a diagonal matrix with at least one diagonal and at least one circulants is a diagonal matrix formed by rotating an identity matrix over at least one position; the LDPC decoding method being based on a Log-Likelihood Ratio Belief-Propagation algorithm, hereinafter referred to a LLR-BP algorithm, representing passing symbol messages $\lambda_{nm}$ from a respective symbol-node n (0<=n<N) to a connected check-node m (0<=m<M) and passing check node messages $\Lambda_{mn}$ from a respective check-node m to a connected symbol-node n; connections between symbol nodes and check nodes being defined by the parity check matrix H; the LDPC decoding method including:

storing for each symbol node a representation of a respective symbol value of a corresponding symbol of the LDPC code in a first memory;

storing a representation of the respective check node messages $\Lambda_{mn}$ in a second memory;

performing a first computation including computing for a next iteration symbol messages $\lambda_{nm}$ from the representation of a corresponding symbol value stored in the first memory and check node messages from a previous iteration;

performing a barrel shifting operation by receiving symbol messages produced by the first computation arranged in a first sequence and supplying the symbol message in a different sequence in dependence on the rotation of the circulants;

performing a second computation including computing, in accordance with the LLR-BP algorithm, check node messages and storing a representation of the computed check node messages in the second memory; the computation being in dependence on symbol messages received from the barrel shifter by the respective check node; and updating the representation of the symbol values in the first memory in dependence on output of the first and second computation.

These and other aspects of the invention are apparent from and will be elucidated with reference to the embodiments described hereinafter.

DETAILED DESCRIPTION OF EMBODIMENTS

Figure 1:
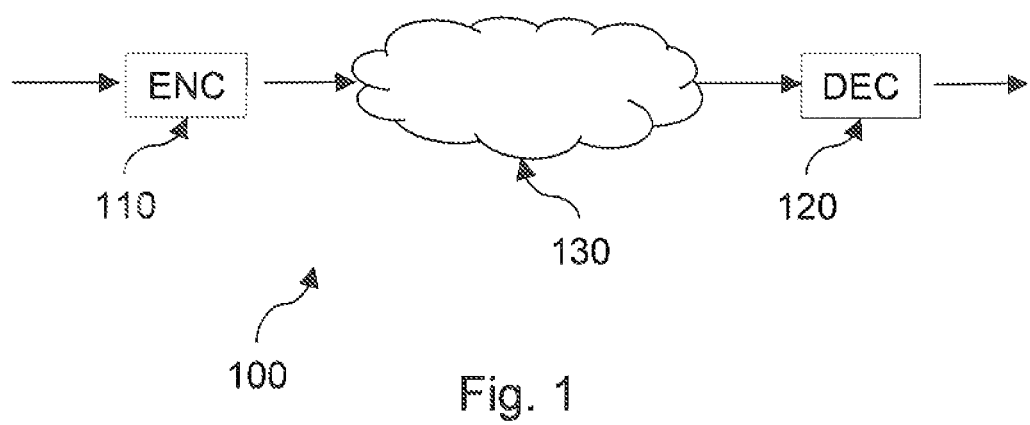
FIG. 1 shows a block diagram of an exemplary system in which the invention may be used.

Where in the Figures same reference numerals are used, they represent the same functionality, unless specified differently. FIG. 1 shows a block diagram of an exemplary system 100 in which the invention may be used. The system includes an LDPC encoder 110 and an LDPC decoder 120. The encoded signal may be transmitted via a transmission medium 130, such as a wireless or wired network. It will be appreciated that the encoded signal may also be stored in a storage system such as a hard disk or optical storage. In this situation item 130 would represent the storage system. Many additional operations may occur which are not shown in FIG. 1, such as encrypting/decrypting, modulating/demodulating the signal, etc. Such operations are well-known and are not part of the invention.

LDPC encoding/decoding in itself is well-known. Here only a short description of the known aspects is given. In a simple example, it is the task of the encoder 110 to encode some binary information (usually referred to as symbols, where a symbol may be just a single bit or may be represented using multiple bits). Assume that it is required to transfer the four information bits S1; S2; S3; S4 with respective values "0"; "0"; "0"; "1". The bits are arranged in a matrix form. To be able to detect and correct transmission errors, first additional parity bits are calculated. The parity bits are such that for a row and/or column of the matrix a predetermined parity equation holds. The parity equation typically is an equation over a Galois Field $GF(r^q)$, where r is a prime number and q is an integer, for example on GF(2), GF(4), GF(8) and more generally on $GF(2^q)$. In the example here, the equation is such that the sum of all bits in each row and column is equal to 0 modulo 2 (i.e. an equation in GF(2)). By adding parity over all rows and columns and also over the parity rows and columns, in this example the 3×3 matrix can be obtained:

$$\begin{bmatrix} S_1 = "0" & S_2 = "0" \\ S_3 = "0" & S_4 = "1" \end{bmatrix} \rightarrow \begin{bmatrix} S_1 = "0" & S_2 = "0" & P_1 = "0" \\ S_3 = "0" & S_4 = "1" & P_2 = "1" \\ P_3 = "0" & P_4 = "0" & P_5 = "1" \end{bmatrix}$$

The bits P1 to P5 are the parity bits. The following six parity check equations hold:

$S1+S2+P1=0 \bmod 2$ $S3+S4+P2=0 \bmod 2$ $P3+P4+P5=0 \bmod 2$ $S1+S3+P3=0 \bmod 2$ $S2+S4+P4=0 \bmod 2$ $P1+P2+P5=0 \bmod 2$ The parity check equations can be represented by a so-called parity check matrix H, which may have the following form:

$$H = \begin{bmatrix} 1 & 1 & 1 & 0 & 0 & 0 & 0 & 0 & 0 \\ 0 & 0 & 0 & 1 & 1 & 1 & 0 & 0 & 0 \\ 0 & 0 & 0 & 0 & 0 & 0 & 1 & 1 & 1 \\ 1 & 0 & 0 & 1 & 0 & 0 & 1 & 0 & 0 \\ 0 & 1 & 0 & 0 & 1 & 0 & 0 & 1 & 0 \\ 0 & 0 & 1 & 0 & 0 & 1 & 0 & 0 & 1 \end{bmatrix}$$

where the symbol sequence is chosen to be: S1 S2 P1 S3 S4 P2 P3 P4 P5. Other sequences may be chosen as well, allowing a rearranging of the matrix. The number of columns in H corresponds to the number of bits (symbols) that need to be transferred (both systematic bits and calculated parity check bits). The position of non-zero elements in H contains the information of which bits are verified in which equation (for example, S1+S2+P1=0 mod 2 is verified in the first row, S3+S4+P2=0 mod 2 is verified in the second row and so on).

A Low Density Parity Check (LDCP) code can be specified by this sparse parity check matrix H. "Low density" means that there are much fewer ones in H than zeros. The structure of the code is completely described by the parity check matrix H. In practice, a H-matrix has much less "1" elements than shown in this example. In the remainder of the description, N denotes the codeword length and M the number of parity check equations. The parity check matrix H consists thus of M rows and N columns with elements "0" or "1". The rows in the matrix are the parity check equations, and the set of elements which have a "1" in a row are the arguments of the equation. For a parity check equation with index m, 0≦m<M, define the set N(m) of codeword symbol positions that it checks, $N(m)=\{n|n=0,1,\ldots,N-1;H_{mn}\neq 0\}$.

The number of elements in N(m) is referred to as $K_m$. Similarly, for a codeword symbol position n, 0≦n<N, define the set M(n) of indices of parity check equations that check the symbol position n $M(n)=\{m|m=0,1,\ldots,M-1;H_{mn}\neq 0\}$.

The number of elements in M(n) is referred to as $J_n$.

Figure 2:
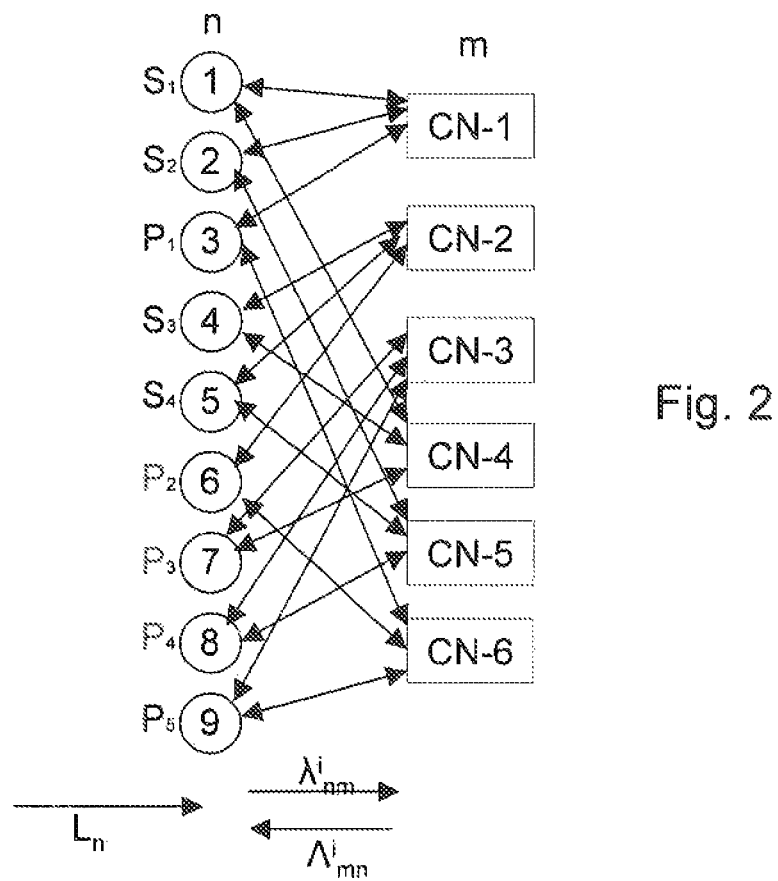
FIG. 2 shows a Tanner graph visualizing the decoding process.

The LDPC algorithm is often visualized by a Tanner graph, which is a bipartite graph. This means that the nodes of the graph are separated into two distinctive sets and edges are only connecting nodes of two different types. An example is shown in FIG. 2 illustrating the H-matrix given above. The two groups of nodes will be referred to as the symbol nodes (nodes to the left) and the check nodes (nodes to the right). The number of symbol nodes corresponds to the number of columns N of matrix H, i.e. the total number of symbol and parity bits that are transferred. The number of check nodes corresponds to the number of rows M that the matrix H has, which is equal to the number of parity check equations. The n-th symbol node (1≦n≦N) and the m-th check node (1≦m≦M) are connected if and only if $H_{mn}$=1. For the example given above, the first check node CN-1 is connected to the first, the second and the third symbol nodes, implying that S1+S2+P1=0 mod 2 is verified in the first parity check equation.

Decoding LDPC codes is based on passing messages between the connected nodes, where the message represent a value that the sending nodes beliefs to be true (or more general: a probability). Various optimizations of such decoding algorithms are known. In general the algorithms are referred to as Belief Propagation algorithms (BP), message passing algorithm (MPA) or the sum-product algorithm (SPA). Typically, the algorithm is executed in the Log domain, to replace multiplication operations by summations. The LDPC decoder does not operate on 'hard bits', i.e. binary symbol values, but on 'soft bits', typically implemented using several bits of data, e.g. eight bits. The integer value represented by those bits is a measure of how likely it is that the encoded symbol bit is a 0 or 1. For example, the integer could be drawn from the range [−127, 127], where: −127 means "certainly 0", −100 means "very likely 0", 0 means "equally likely that it is a 0 or 1", 100 means "very likely 1", 127 means "certainly 1", etc. After a sufficient number of iterations, depending on if either all parity checks are satisfied or if a maximum number of iterations is reached, based on the stored value for the symbol a hard decision, i.e. a decoded bit, can be supplied. The LDPC decoder is initialized with soft bits, supplied by the demodulator of the transmission or storage system via which the bits were received from the encoder. For example, for each bit, the front end of a traditional wireless-receiver would provide an integer measure of how far an internal analogue voltage representing the received bit/symbol is from a given threshold. The soft bit value initializing symbol node n is indicated as $L_n$ in FIG. 2. Instead of operating directly on a likelihood, generally LDPC decoders operate on a Log-Likelihood Ratio (LLR) of received information, for example the logarithm of the probability that a '0' is transmitted divided by the probability that a '1' is transmitted (or the other way around: the logarithm of the probability that a '1' is transmitted divided by the probability that a '0'). In general, a conditional log likelihood ratio of x given that y has already occurred is:

$$LLR(x) = \log\frac{p(0|y)}{p(1|y)}$$

This equation can be 'solved' with knowledge of the transmission system. For example, in a simple transmission system a bit to be transmitted may be mapped to one of two values of equal power (e.g. represented as +1 and −1) (e.g. a binary "0" bit is mapped to +1 and a binary "1" is mapped to −1). The transmission channel between the encoder and decoder may be represented as a Gaussian channel (with Gaussian noise being added). Assuming further that the likelihood of a "1" or "0" being transmitted is equal, then $$LLR(x) = \log \frac{p(0|y)}{p(1|y)} = \frac{2r}{\sigma^2}$$

where r is the received bit value and $\sigma^2$ is the noise variance.

The LDPC decoding used by the invention is "Belief-Propagation based" (BP Based) algorithm in the log domain (LLR-BP based), where LLR stands for Log-Likelihood Ratio. The algorithm can be based upon the tan h function, the Gallager approach, Jacobian transformed, approximated BP with the Minimum function, normalized BP, offset BP or combinations of this, as explained in J. Chen e.a. in "Reduced complexity decoding of LDPC codes", IEEE Transactions on Communications, volume 53, pages 1288-1299, 2005. In the remainder such algorithms will be referred to as LLR-BP based algorithms. A preferred form of such an algorithm is the normalized min-sum LDPC decoding algorithm. This algorithm achieves a performance level very close to, or sometimes even out performing that of the more general belief propagation (BP) decoding, while offering significant hardware advantages. The detailed description given below is based on the normalized min-sum algorithm although it will be appreciated that the concept applies equally well to other forms of the belief propagation algorithm.

The set of vertices (V) of the graph is the union of the set of N symbol-nodes and the set of M parity check-nodes. The set of edges (E) consisting of all edges (m, n) for which $H_{mn}=1$. Classical iterations of the LDPC algorithm consist of information sent from symbol-nodes (N) via the edges (E) to the check-nodes (M) and back. The symbol node in question will be indicated with index n and the check node with index m.

For a given iteration i of the min-sum algorithm, the following variables are defined (the messages are also shown in FIG. 2):

$L_n$—The x bit, signed input message into symbol-node n. For example, if BPSK modulation was used for transmitting the encoded word, $L_n$ may be the following:

$$L_n = \frac{2y_n}{\sigma^2} \quad (1)$$

wherein $y_n$ is the received BPSK symbol value, and $\sigma^2$ is the noise variance. It will be appreciated that any suitable modulation technique may be used.

$\lambda_{nm}^i$—The message sent from symbol-node n to check-node m in the $i^{th}$ iteration. This message will also be referred to as 'symbol message'. In general, this symbol message depends on the original value received in symbol node n (being $L_n$) and update messages received from connected check nodes. So, in the first iteration only $L_n$ is sent as a symbol message. The update messages from the check nodes are indicated as $\Lambda_{mn}^i$. In a traditional LDPC decoding, $\lambda_{nm}^i$ may be chosen to be:

$$\lambda_{nm}^i = L_n + \sum_{m' \in M(N) \setminus n} \Lambda_{m'n}^{i-1} \quad (2)$$

Note: that in this equation the summation is over all check nodes m' to which symbol node n is connected (being M(n)), but not check node m to which the message is sent. This is to avoid instabilities. It is further noted that the update messages $\Lambda_{mn}^{i-1}$ are from the previous iteration i−1. As will be described below, this is not strictly required.

$\Lambda_{mn}^i$—The message sent from to check-node m to symbol-node n in the $i^{th}$ iteration. The message will also be referred to as 'check node message'. This message depends on the symbol messages received by check node m. The message may be initialized as:

$\Lambda_{mn}^0=0$

The update of this message is preferably based on all symbol messages received by the check node, i.e. from all symbol nodes connected to check node m (being N(m)), with the exception of the symbol node n to which the check node message is going to be sent. Basing the update solely on the message values at the start of the current iteration, and using the min-sum algorithm gives:

$$\Lambda_{mn}^i = \underset{n' \in N(m) \setminus n}{XOR} (\{\text{sign}(\lambda_{n'm}^i)\}) * \alpha * \underset{n' \in N(m) \setminus n}{MIN} \{|\text{sign}(\lambda_{n'm}^i)|\} \quad (3)$$

where XOR is defined as the sign equivalent of the Boolean xor function, i.e. XOR(−,−)=+. It is noted that α is a correction factor, well-known from the normalized min-sum algorithm.

$\lambda_n$—The decoder output messages. Unlike is usually the case for the $\lambda_{nm}$'s, the decoder output message $\lambda_n$ typically uses all information available in a symbol-node n, and is only necessary in the last iteration I.

$$\lambda_n = L_n + \sum_{m \in M(n)} \Lambda_{mn}^i \quad (4)$$

In the formula given above, the decoding in iteration i is statically based on the information obtained at the end of the previous iteration i−1. Such a form of iteration can be seen as a Jacobi iteration. This algorithm can be changed to include Gauss-Seidel iterations, a technique also known as "staggered decoding", "turbo decoding LDPC", "shuffled decoding", and "layered decoding". In this version of the LDPC decoding, the decoding is not statically based on the information obtained at the end of the previous iteration, but immediately already uses information obtained in the current iteration i. For this, the check-node centric processing of LDPC is used. A variable $\lambda_n^i$ is used, which consists of the sum of $L_n$ and the most up to date messages between check-nodes and symbol nodes:

$$\lambda_n^i(m) = L_n + \sum_{m' \in U(n,m)} \Lambda_{m'n}^i + \sum_{m' \in R(n,m)} \Lambda_{m'n}^{i-1} \quad (5)$$

In this equation, the set $U(n,m) \subset M(n)$ relates to the messages which have already been updated in the current iteration i before processing by check-node m, and $R(n,m)=M(n)\setminus U(n,$ m), being the remaining set of messages not yet updated. For Jacobi iteration, $U(n,m)=\emptyset$, and for Gauss-Seidel $U(n,m)$ is defined as:

$$\emptyset \subset U(n,m_1) \subset U(n,m_2) \subset \ldots \subset U(n,m_j) \quad (6)$$

This equation allows for parallel updating in several check nodes. The check nodes updated in the first cycle are referred to as $m_1$, those updated in the second cycle as $m_2$, etc. Typically not all check nodes can be updated in parallel since that would give memory conflicts. A schedule assigns check nodes to cycles of parallel checking.

The value of $\lambda_{nm_x}^i$ is given by:

$$\lambda_{nm_x}^i = \lambda_n^i(m_x) - \Lambda_{m_x n}^{i-1} \quad (7)$$

and after calculating $\Lambda_{m_x n}^i$ in the current check node $m_x$, $\lambda_n^i$ is updated as:

$$\lambda_n^i(m_{x+1}) = \lambda_{nm_x} + \Lambda_{m_x n}^i \quad (8)$$

Figure 3:
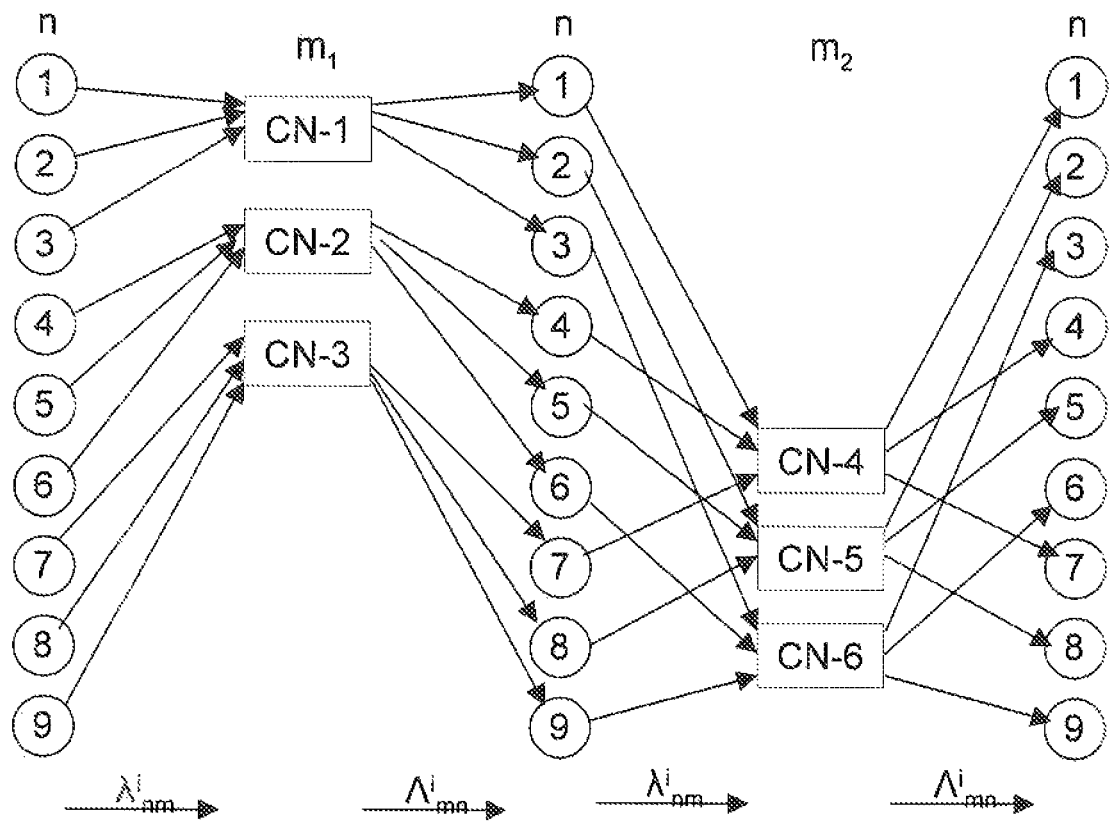
FIG. 3 shows an example of performing an iteration in two groups.

In this equation, $m_{x+1}$ is thus the check node (or set of check nodes processed in parallel) processed after in the previous cycle check node $m_x$ (or set of parallel processed check nodes) has been processed. FIG. 3 illustrates this where iteration i is executed in two main groups. In the first group the check nodes CN-1 to CN-3 are processed (forming the set $m_1$) and in the next group of the same iteration, the remaining check nodes CN-4 to CN-6 are processed (forming the set $m_2$).

Figure 4:
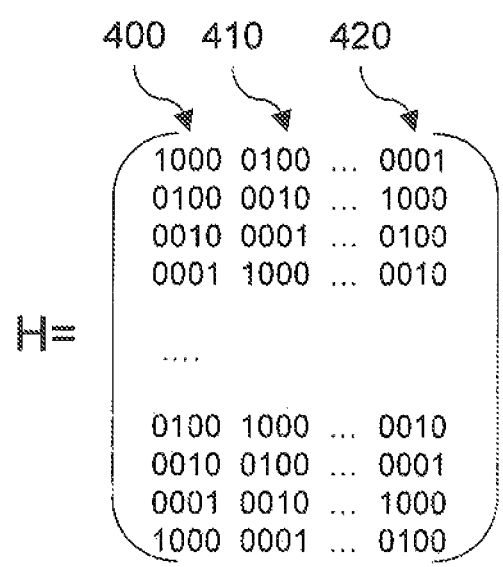
FIG. 4 illustrates a circulant parity check matrix.
Figure 5A:
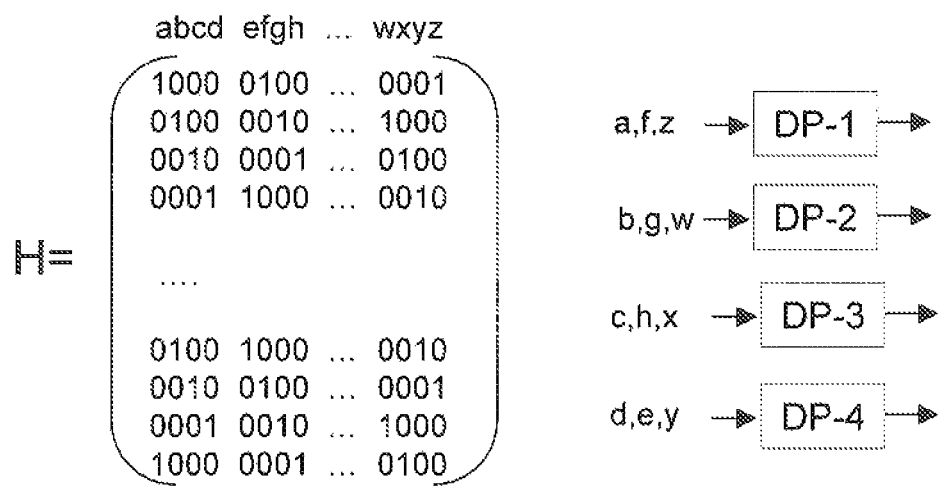
FIGS. 5a and 5b illustrate the role of a barrel shifter.
Figure 5B:
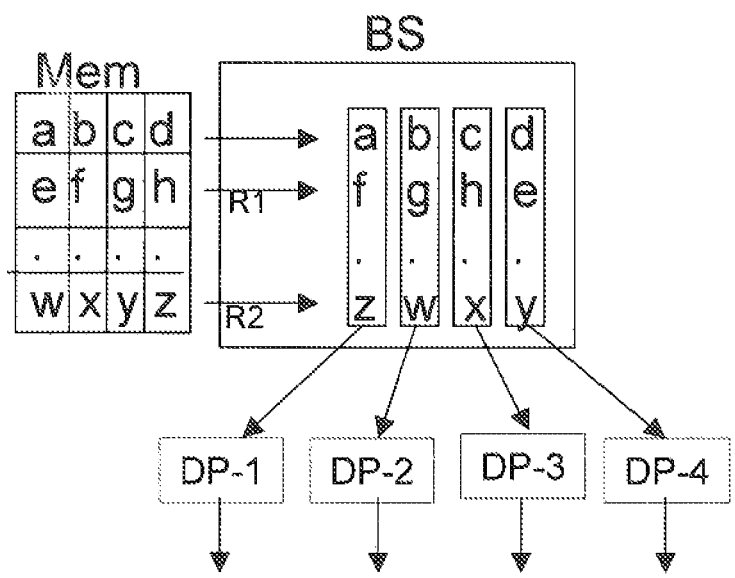

The LDPC codes standardized in today's communication standards, such as DVB-S2, 802.11n, 802.16e, DMB-T, and STiMi, all contain quasi-cyclic structures. This implies that the H-matrix, which describes the interconnect between symbol-nodes and check-nodes (e.g. N(m) and M(n)) is build up of circulants. These circulants consist of either the zero-matrix or an identity-matrix, rotated over a certain angle. In some of the standards multiple diagonals occur in one circulant. In DVB-S2, the LDPC code consists of 64800 bits of which, for code rate ½, half are systematic bits (original input bits to the encoder) and half are parity bits. A total of 32400 parity equations are used, giving an H-matrix with 64800 columns and 32400 rows. The matrix is sub-divided in blocks (circulants) of 360 by 360. FIG. 4 shows an exemplary structure of a circulant H-matrix. In this example, the circulants are only 4×4 blocks. Circulant 400 is the identity matrix. Circulant 410 is rotated to the right by one position. Circulant 420 is rotated to the right by three positions. Of course a rotation to the right can also be seen as a rotation to the left. A favorable property of building up the H-matrix by means of circulants is that all data belonging to one (sub)-circulant can be stored in one line of the memory, retrieved in one clock cycle, and by means of rotation can be send to the correct data paths, where the data path performs at least part of the processing represented by the check node. FIGS. 5A and 5B illustrate a situation where a row of circulants is checked in parallel. Each row of the matrix is checked by a respective data path. In the example of FIG. 5, a circulant has four rows, so preferably four equations are checked in parallel by respective data paths. FIG. 5A illustrates that the symbol nodes at the beginning of the iteration store the values a to z. The first equation (=first data path DP-1) should check the symbol nodes with a, f, and z (in this example intermediate circulants indicated by . . . are ignored). The second equation should check b, g, w; the third equation c, h, x and the fourth equation d, e, y. FIG. 5B illustrates how the symbol values can be stored in a memory Mem, where a row in the memory is the size of the circulant. In this example, each sequential row stores the elements of the corresponding symbol node values. A so-called barrel shifter BS reads out a row from the memory and, where applicable, rotates the elements in the row. In this example, the elements a to d correspond to the first circulant, which is the identity matrix. No rotation is required. The next group of elements e to h correspond to the second circulant. This circulant is a single diagonal rotated one to the right. By performing an inverse rotation R1 (i.e. one position to the left, which is the same as three to the right), the element to be operated on by the first data path is now also in a first 'column'. Similarly, the last group of elements w to z corresponds to the last circular with a single diagonal rotated three to the right. By rotating the elements three to the left (or one to the right), again the element of the last group to be operated on by the first data path is now also in the first 'column'. So, the first data path DP-1 can be loaded with the first column produced by the barrel shifter. The second column automatically gives the elements for the second data path DP-2, etc. Barrel shifters in itself are well-known for rotating the elements and provide the desired output to the respective data paths. An example of barrel shifter is also shown in G. M. Tharakan and S. M. Kang "A New Design of a Fast Barrel Switch Network" IEEE Journal of solid-state circuits. Vol. 21. No 2. February 1992. Other arrangements then the one shown in FIG. 5B may be used as well. It will be appreciated that the same concepts also apply where instead of using a circulant a sub-matrix is used with a same number of one-elements in each row and column. Instead of performing a rotation, then a slightly more complex permutation needs to be performed. The unit performing this permutation can be seen as a shuffler. The remainder of the description will focus on circulant and refer to the shuffler as the barrel shifter. It will also be appreciated that a multi-diagonal circulant can be seen as a special version of a sub-matrix with a same number of multiple non-zero elements in each row and column. The architecture according to the invention will be detailed for circulant but can be applied in a same way for the more general case.

Figure 6:
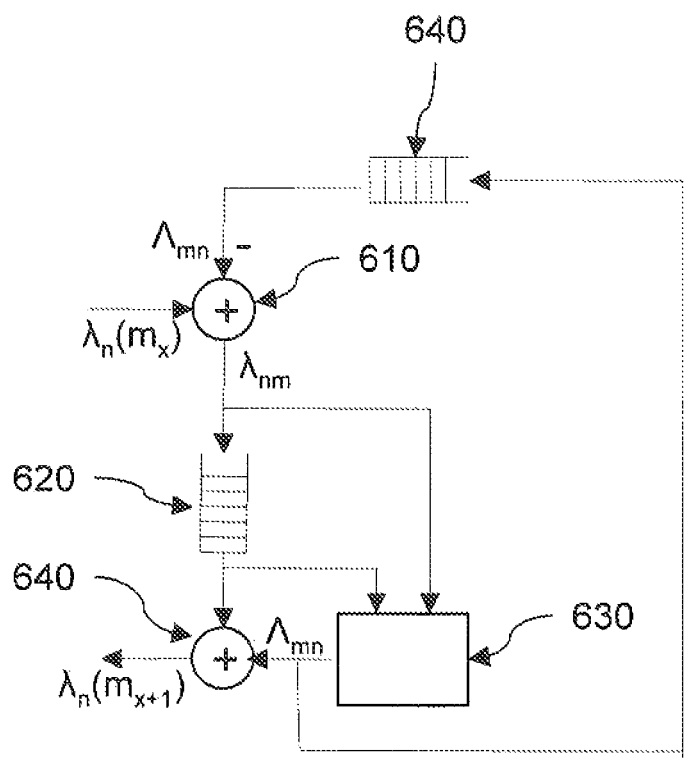
FIG. 6 shows a prior art data path.

The kernel of a conventional architecture of an LDPC decoder is formed by the data path, shown in FIG. 6. As explained above, the $K_m$, $\lambda_{nm}^i$'s are formed by subtracting the $\Lambda_{mn}^{i-1}$ from the $\lambda_n^i(m)$'s arriving sequentially from a first memory storing those values. The $\lambda_{nm}$'s are used to calculate Equation (3) shown as 610 in FIG. 6. When having to calculate the minimum of all except yourself for all participants, the equation set has only two output values: the overall minimum and the one-but minimum. The position of the minimum (i.e. an identification of the participant that gave the minimum) is also stored. Calculating these two values is called "running vector calculation", and the vector is denoted as $\Lambda_m$. Calculating the individual $\Lambda_{mn}$ is a decompression of this vector. The running vector calculation and decompression is shown as block 630. In itself such a compression/decompression is well-known for the min-sum algorithm. Simultaneously to calculating $\Lambda_m$, the $\lambda_{nm}$'s are stored in a buffer, preferably a FIFO 620, for later use. During the next $K_m$ cycles this is repeated for the next parity check equation, while for the current parity check equation, the individual $\Lambda_{mn}^i$ are calculated by the mentioned decompression. The $\Lambda_{mn}^i$ are added in block 640 to the $\lambda_{nm}$ from the FIFO 620, which results in the new $\lambda_n^i(m)$ (Eq. 7). The data path thus produces the $K_m\lambda_n$'s of one parity equation, while receiving the $K_m\lambda_n$'s for the next equation. This data-path can handle one connection between a check-node and a symbol-node per clock cycle. To avoid a read of $\lambda_{n1}$ before a write of $\lambda_{n2}$ for $n_1=n_2$ the order of the parity equations must be statically scheduled. When not achieving this no-operations must be inserted, leading to lower throughputs. As described above, most LDPC codes are composed of circulant structures such that parity equations can be calculated simultaneously. When the circulant size of the code is equal to the number of data paths and there is at most one diagonal in a circulant, the decoder can compute multiple parity check equations without memory conflicts.

Figure 7:
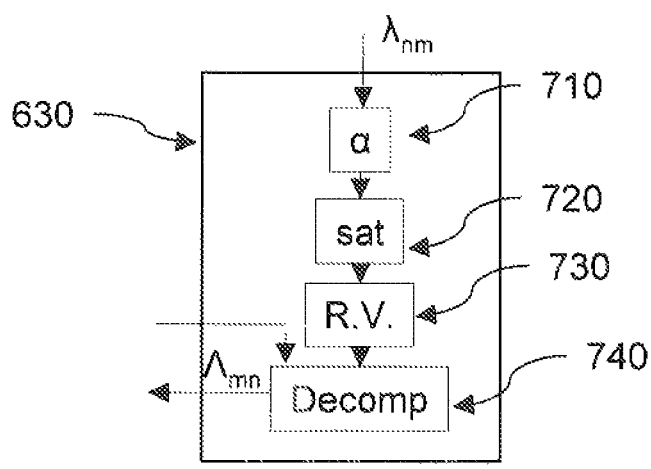
FIG. 7 shows details of the data path for the min-sum algorithm.

FIG. 7 shows conventional details of block 630 of FIG. 6 for the min-sum algorithm. Block 710 shows applying the correction factor α being multiplied to the input, as shown in equation (3). Block 730 shows the running vector calculation. Block 740 shows the decompression. Block 720 illustrates a saturation function, which reduces the range of the output of block 710 to a predetermined range, typically eight bits. The saturation may be done in any suitable way, such as clipping/rounding or scaling. In itself this is well-known.

Figure 8:
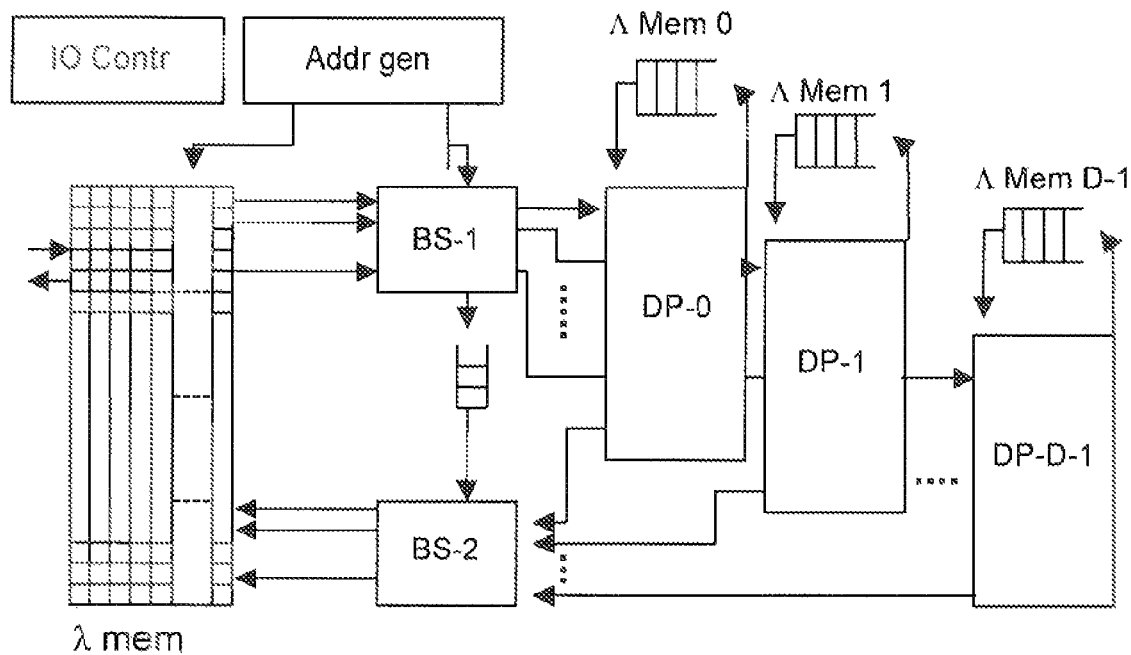
FIG. 8 shows a conventional top-level architecture.

FIG. 8 shows a conventional top-level architecture, which includes D parallel data paths DP-0 to DP-D−1 that each correspond to the data path shown in FIG. 6 and detailed in FIG. 7. In this architecture a first memory λ-mem stores the $\lambda_n$ values, and a second memory, shows as the memories "Λ Mem 0" to "Λ Mem D−1" store the uncompressed $\Lambda_{mn}$ values. In this example, memory "Λ Mem 0" stores the values $\Lambda_{0n}, \Lambda_{Dn}, \Lambda_{2Dn}, \ldots$; memory "Λ Mem 1" stores the values $\Lambda_{1n}, \Lambda_{1+Dn}, \Lambda_{1+2Dn}, \ldots$, etc.

The (memory) efficiency of the proposed architecture is achieved by using the property that the set of data to/from the data paths always exists in one word in the memory. When applying the technique described in [Dielissen, DATE], the circulants are split into multiple smaller sub-circulants, for which the diagonal property prevails.

Figure 9:
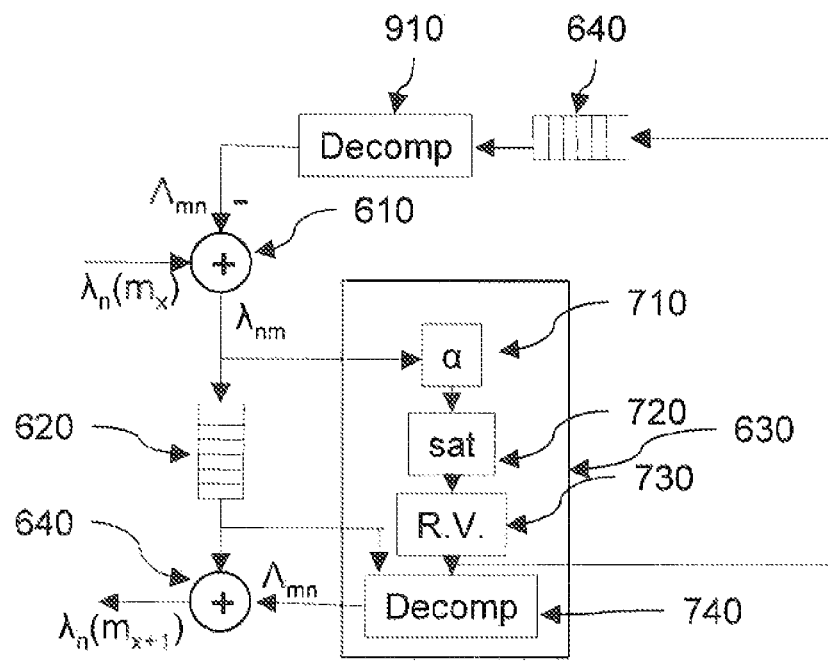
FIG. 9 shows a conventional data path utilizing a compressed Λ storage.

For most of the standards, the largest part of the silicon area required for the LDPC decoder is consumed in the second memory, comprising the Λ-memories. Since the magnitudes stored in these memories only contain the minimum or the one-but-minimum of an equation, these values can be compressed as described above. The achievable compression factor is $$\frac{b*K}{2*b+\log_2(K)}$$

where b is the number of bits, required for storing the magnitude, and K is the number of participants in an equation. For K equal to 30, this compression-factor is approximately 10. FIG. 9 show the changes in the data path in order to utilize the compressed Λ storage. FIG. 9 is a combination of FIGS. 6 and 7, where now the Λ-memories store the $\Lambda_{mn}$ values in compressed form. This can be seen in FIG. 9 by tapping of the values to be stored in memory 640 before the decompression block 740. To be able to use the compressed stored values, a further decompression block 910 is used after the storage.

There are however a couple of side notes to using a compressed Λ storage:

The total storage capacity in the Λ-memories depends on all codes required for one standard. As an example, DVB-S2 has 12 rates prescribed, where K ranges from 4 to 30. The number of vectors that need to be stored in the memories differs for each rate. For the used rates in DVB-S2, this implies an overall compression factor of 3.4 when assuming b=5.

Instead of writing the 2*b+logs(K) bits in one word of the Λ-memory it is possible to use K cycles for reading and writing, which increases the area-utilization of the memory at the expense of extra logic.

When targeting an FPGA technology where two-port memories are available, and the height is already fixed, compression of Λ's does not give any advantage.

When the number of "sub-layers" to be processed is rather low, the height of the compressed memory might be such low that nearly no area advantage can be achieved by compression.

The architecture shown in FIG. 8 shows using a barrel shifter BS-1 in the forward path and BS-2 in the backward path. BS-1 receives rotation instructions from the address generator "Addr gen". These instructions (or a reverse version thereof) are also stored in the FIFO connecting BS-1 and BS-2, so that at the right number of cycles later BS-2 can perform the inverse rotation compared to the rotation done by BS-1 on the same element of the sequence. The architecture can be further optimized by omitting the barrel shifter BS-2 in the backward path. In such a configuration, the barrel shifter BS-1 in the forward path must now compensate for the fact that data is written rotated back into the first memory "λ mem". The single barrel shifter architecture is not shown separately. The I/O controller "IO Contr" and the address generator "Addr gen" of FIG. 8 can be programmed suitably to control the barrel shifter BS-1. In itself this falls well within the skills of the skilled person.

The architectures presented so far are in itself efficient for single-diagonal circulants. The architectures conduct the following computations:

$$\lambda_{nm_x} = \lambda_n^i(m_x) - \Lambda_{m_x n}^{i-1}$$

calculate $\Lambda_{m_x n}^i$ $$\lambda_n^i(m_{x+1}) = \lambda_{nm_x} + \Lambda_{m_x n}^i$$

As an example where symbol-node n is connected to two check nodes in the same circulant (e.g. a dual diagonal) the next situation occurs:

$$\lambda_n^i(m_1) = L_n + \Lambda_{m_1 n}^{i-1} + \Lambda_{m_2 n}^{i-1}$$

$$\lambda_{nm_1} = \lambda_n^i(m_1) - \Lambda_{m_1 n}^{i-1} = L_n + \Lambda_{m_2 n}^{i-1}$$

$$\lambda_{nm_2} = \lambda_n^i(m_1) - \Lambda_{m_2 n}^{i-1} = L_n + \Lambda_{m_1 n}^{i-1}$$

calculate $\Lambda_{m_1 n}^i$ and $\Lambda_{m_2 n}^i$ $$\lambda_n^i(m_2) = \lambda_{nm_1} + \Lambda_{m_1 n}^i = L_n + \Lambda_{m_1 n}^i + \Lambda_{m_2 n}^{i-1}$$

$$\lambda_n^i(m_3) = \lambda_{nm_2} + \Lambda_{m_2 n}^i = L_n + \Lambda_{m_1 n}^{i-1} + \Lambda_{m_2 n}^i \neq L_n + \Lambda_{m_1 n}^i + \Lambda_{m_2 n}^i$$

In other words, the $\Lambda_{m_1 n}^i$ is overwritten by the old $\Lambda_{m_1 n}^{i-1}$.

Figure 10:
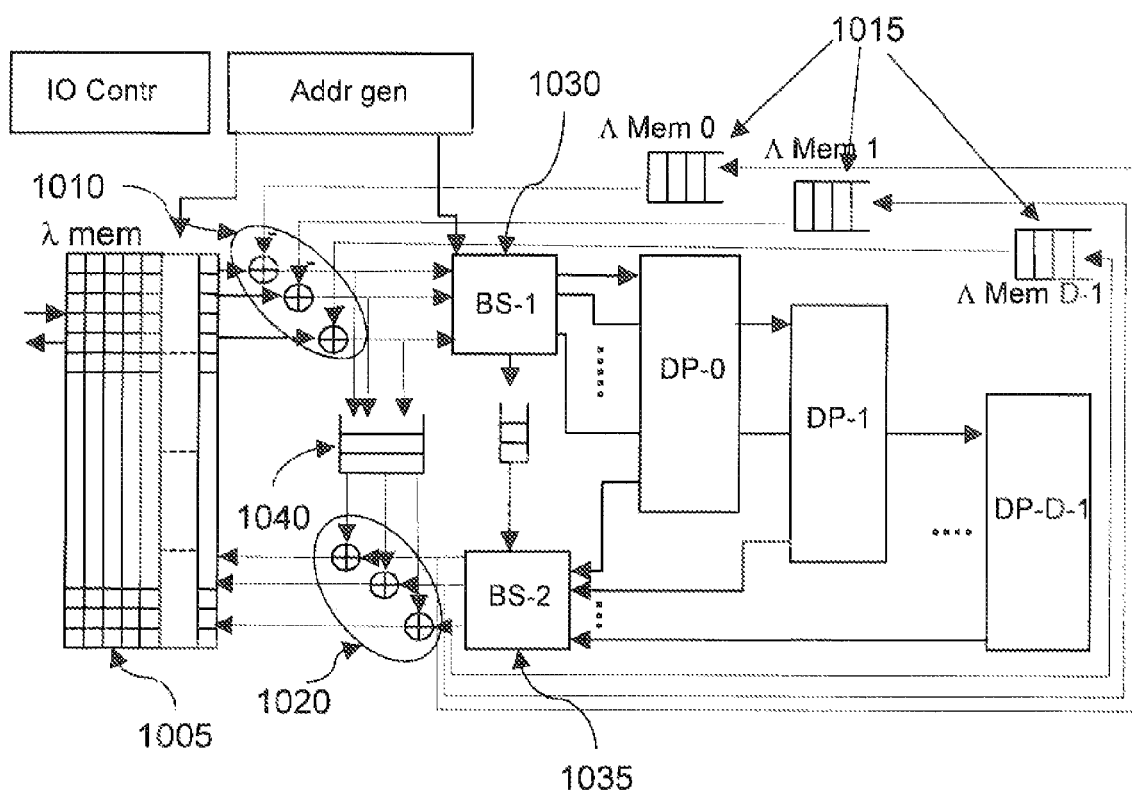
FIG. 10 shows a basic implementation of the LDPC decoder architecture according to the invention.

FIG. 10 shows a basic implementation of the LDPC decoder architecture according to the invention. The LDPC decoder includes a first memory 1005 for storing for each symbol node n a representation of a respective symbol value $\lambda_n$ of a corresponding symbol of the LDPC code. Assuming that the symbols of the LDPC code are sequentially numbered from 0 to N−1, then for symbol node n the n-th symbol is stored. The LDPC decoder further includes a second memory 1015 for storing a representation of the respective check node messages $\Lambda_{mn}$. In this example, the second memory 1015 is subdivided in memories, preferably FIFOs, as shown in FIG. 8. The LDPC decoder further includes first computation means 1010 for computing for a next iteration symbol messages $\lambda_{nm}$ from the representation of a corresponding symbol value stored in the first memory 1005 and check node messages $\Lambda_{mn}$ from a previous iteration. In an embodiment, the first computation means 1010 computes: $\lambda_{nm}^i = \lambda_n^i(m) - \Lambda_{mn}^{i-1}$ according to equation (7) given above. For each data path 0 to D−1 the computation is done for a different one of the symbol nodes. D calculations are performed in parallel. So, for the first batch nodes 0 to D−1 are processed, for the second batch D to 2D−1, etc. As such, the first computation means 1010 is arranged to perform D subtractions in parallel. The LDPC decoder further includes a barrel shifter 1030 for obtaining symbol messages from the first computation means 1010 arranged in a first sequence and supplying the symbol message in a different sequence in dependence on the rotation of the circulants. The barrel shifter 1030 may in principle be in the same as already described above with reference to FIG. 5B wherein the symbol messages may be received arranged according to the sequence of the symbol nodes and are rearranged by performing a reverse rotation compared to the rotation of the identity matrix to the diagonal matrix involved and finally issuing the symbol messages in the column direction. The task of the barrel shifter is to simply change the sequence as defined by the circulants.

The LDPC decoder further includes second computation means for computing, in accordance with the LLR-BP (Log-Likelihood Ratio Belief-Propagation) algorithm, check node messages $\Lambda_{mn}$ and for storing a representation of the computed check node messages in the second memory 1015. The computation depends on symbol messages $\lambda_{nm}$ received from the barrel shifter 1030 by the respective check node m. At least part of the computation performed by the second computation means is performed in the data paths DP-0 to DP-D−1 after the barrel shifter 1020, so in the rotated domain. In an embodiment, the min-sum algorithm is used and the second computation means 1020 computes:

$$\Lambda_{mn}^i = \mathop{XOR}_{n' \in N(m) \setminus n} (\{\text{sign}(\lambda_{n'm}^i)\}) * $$
$$\alpha * \mathop{MIN}_{n' \in N(m) \setminus n} \{|\text{sign}(\lambda_{n'm}^i)|\} \text{ according to eq. (3).}$$

The LDPC decoder further includes third computing means 1020 for updating the representation of the symbol values in the first memory in dependence on output of the first and second computing means. In a preferred embodiment, the third computation means 120 performs the following calculation $\lambda_n^i(m_{x+1}) = \lambda_{nm_x} + \Lambda_{m_x n}^i$ according to eq. (8).

A main difference with the known architecture of FIG. 8 is that the computation of $\lambda_n^i(m) - \Lambda_{mn}^{i-1}$ is conducted in the "linear domain", e.g. before the barrel shifter 1030. Also the storage of $\lambda_{nm}$ in a FIFO 1040 and the addition, $\lambda_{nm} + \Lambda_{mn}^i$ to obtain $\lambda_n$ are executed before the barrel shifter, i.e. in the linear domain.

In an embodiment according to the invention, the representation of the symbol messages is stored in the first memory in a predetermined sequence as describe already above. The LDPC decoder including a further barrel shifter 1035 arranged in between the second computation means and third computation means 1020 for supplying check node messages in a sequence corresponding to said predetermined sequence. As already described above, the barrel shifter 1035 in the backward path re-establishes the original sequence used in the first memory.

Figure 11:
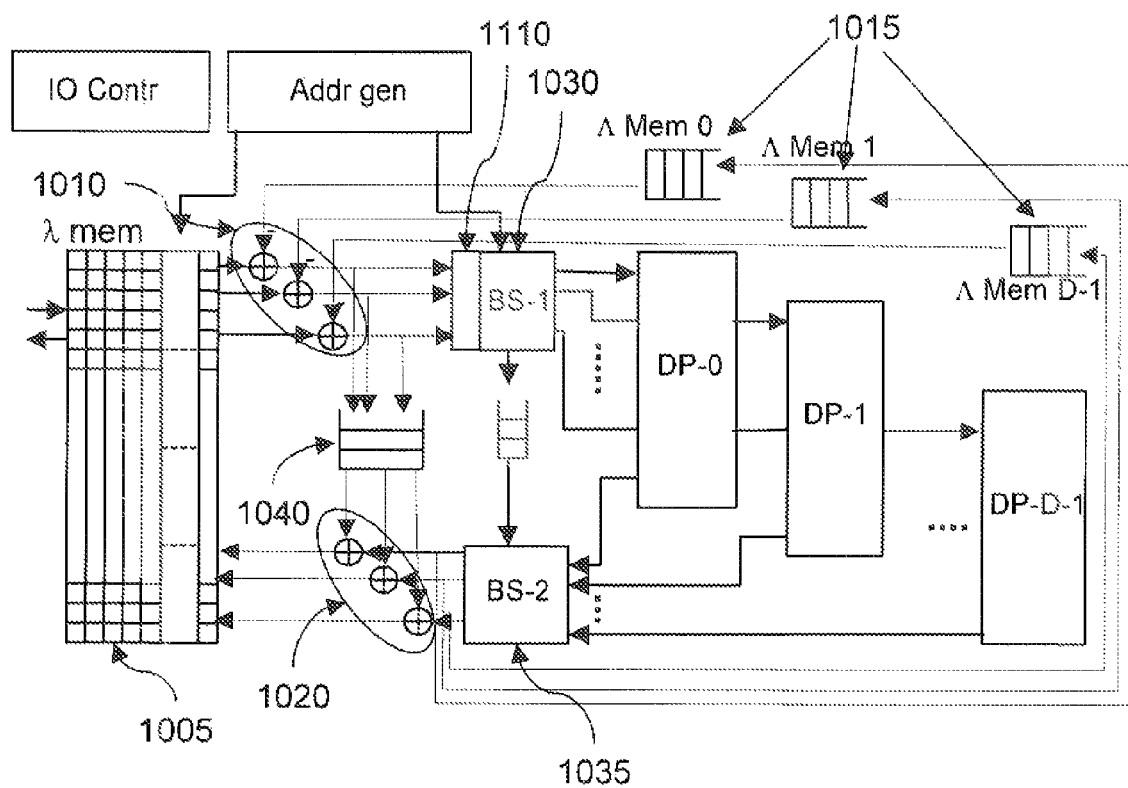
FIG. 11 shows performing correction and saturation based on a min-sum algorithm before the barrel shifter.
Figure 12:
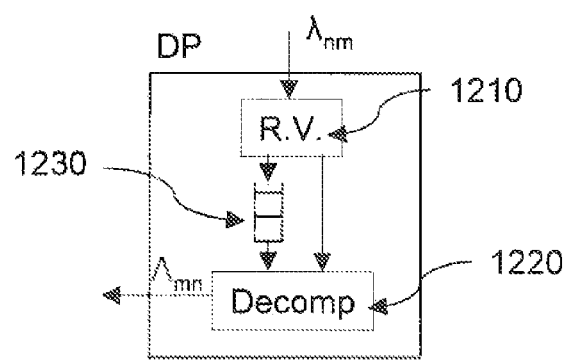
FIG. 12 shows a preferred data path.

In a further embodiment as shown in FIG. 11, the LLR-BP algorithm is based on a min-sum algorithm and the LDPC encoder includes correcting means for multiplying a value of a symbol message by a corrective factor α and saturation means for restricting a value to a predetermined range. The correcting means in itself have already been shown in FIG. 7 as block 710 and the saturation means as block 720. It will be appreciated that first the correction is done before the saturation (the correction may already reduce the value range). As shown in FIG. 11, the combination of the correcting means and saturating means, shown as block 1110, are arranged in between the first computation means and the barrel shifter. This leads to different area cost of the integrated circuit on which the LDPC encoder may be implemented: By performing the multiplication with α and the saturation before the barrel shifter 1030, the barrel shifter 1030 then can have the bit-width of the $\Lambda_{mn}$'s which is 1 to 3 bits less than the $\lambda_n$ widths in the other case. It is noted that one additional 1-bit FIFO is required for storing the signs. The 1-bit FIFO is shown in FIG. 12 as block 1230. However, the 1-bit FIFO can be optimized away when communicating the xor-total via the barrel shifter, and conducting the xor in the adder directly before the λ-memory 1005.

In the preferred embodiment as shown in FIG. 11, the data path executed by the second computation means is very simple, as illustrated in FIG. 12. Block 1210 shows the running vector calculation which in principle is the same as shown for block 730 of FIG. 7. Block 1220 shows the vector decompression which in principle is the same as shown for block 740 of FIG. 7. Block 1230 shows the 1-bit FIFO for storing the sign.

Figure 13:
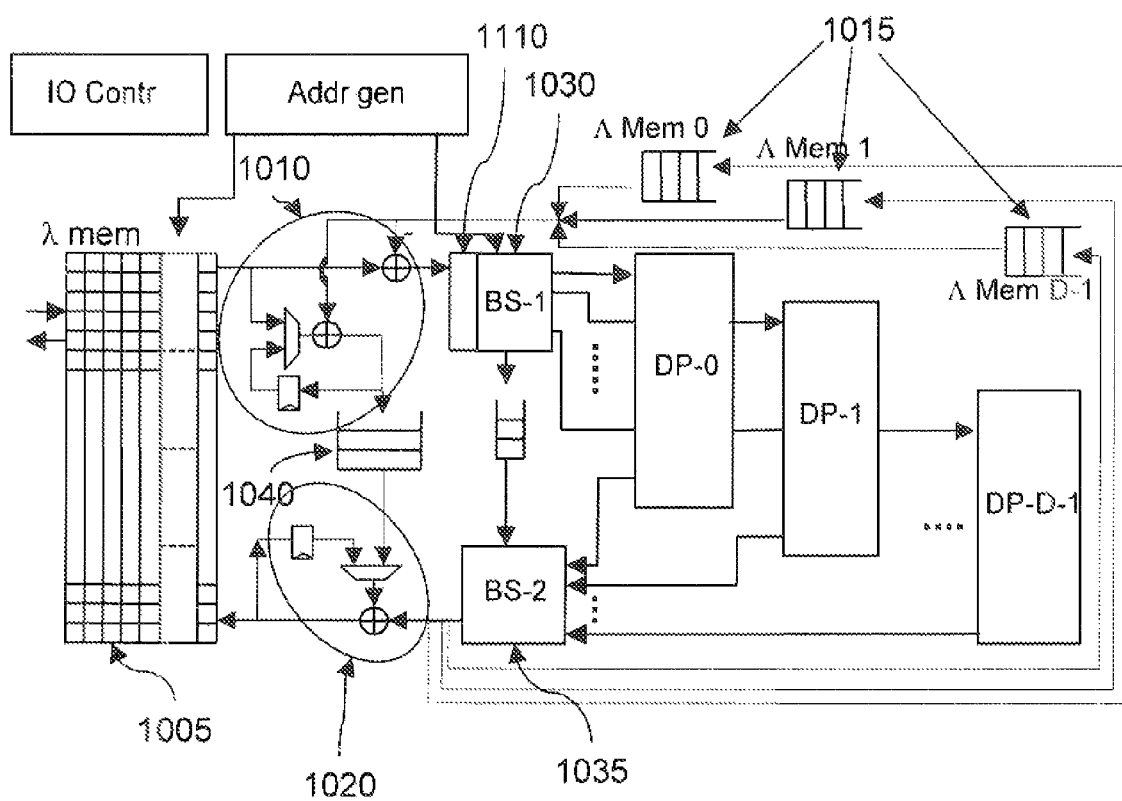
FIG. 13 shows the architecture for handling multiple diagonals.

The architecture shown in FIGS. 10 and 11 can be modified quite easily to handle multiple diagonal conflicts. In such an embodiment, at least one of the circulants is a matrix with a plurality of diagonals each being formed by rotating an identity matrix over a respective distinct number of positions. The first computation means 1010 are now arranged to compute symbol messages $\lambda_{nm}^i$ that correspond to a multi-diagonal circulants in dependence on associated check node messages that each correspond to a respective one of the diagonals in the circulants. So, if the circulants has two diagonals the first computation means issues two respective $\lambda_{nm}^i$'s; for three diagonals three respective $\lambda_{nm}^i$'s are issues, etc. Preferably, the first computation means is arranged to iteratively compute the symbol messages $\lambda_{nm}^i$ that relating to a single symbol node n by in each iteration combining a respective one of the associated check node messages $\Lambda_{mn}$ to a computed result. This iterative arrangement is shown in FIG. 13. As in the previous architectures, the FIFO 1040 may store the $\lambda_{nm}^i$, and by adding in block 1020 the $\Lambda_{m_x n}^i$ and $\Lambda_{m_{x+1} n}^i$, the new $\lambda_n^i$ is calculated. In the case of dual diagonals, block 1010 twice subtracts a check node message $\Lambda_{m_x n}$ and $\Lambda_{m_{x+1} n}$. The FIFO 1040 stores then $\lambda_n^i - \Lambda_{m_x n}^{i-1} - \Lambda_{m_{x+1} n}^{i-1}$. By adding in block 1020 the new $\Lambda_{m_x n}$ and $\Lambda_{m_{x+1} n}$ respectively, the new $\lambda_n^i$ is calculated. As an example, assume that a symbol node n is connected to two check nodes 1 and 4 in the same circulants (e.g. a dual diagonal), then the following value is read from the first memory 1005: $\lambda_n = L_n + \Lambda_{1n} + \Lambda_{4n}$. From this first $\Lambda_{1n}$ is subtracted in block 1010 using two subtractors. One output, being $L_n + \Lambda_{4n}$, is fed to the barrel shifter 1030 and the same value is also stored in the FIFO 1040. In the second cycle, $\Lambda_{4n}$ is subtracted by both subtractors. The data path to the barrel shifter is still fed by $\lambda_n = L_n + \Lambda_{1n} + \Lambda_{4n}$, so after subtraction of $\Lambda_{4n}$ by the subtractor, the barrel shifter is supplied with $L_n + \Lambda_{1n}$ (of course optionally after the correction and saturation). The other subtractor is in this cycle fed through the second path of the multiplexer in block 1010 and thus is fed with $L_n + \Lambda_{4n}$. Subtracting $\Lambda_{4n}$ thus results in $L_n$ being stored in FIFO 1040. It is noted that in this the 1-bit FIFO must be implemented.

Figure 14:
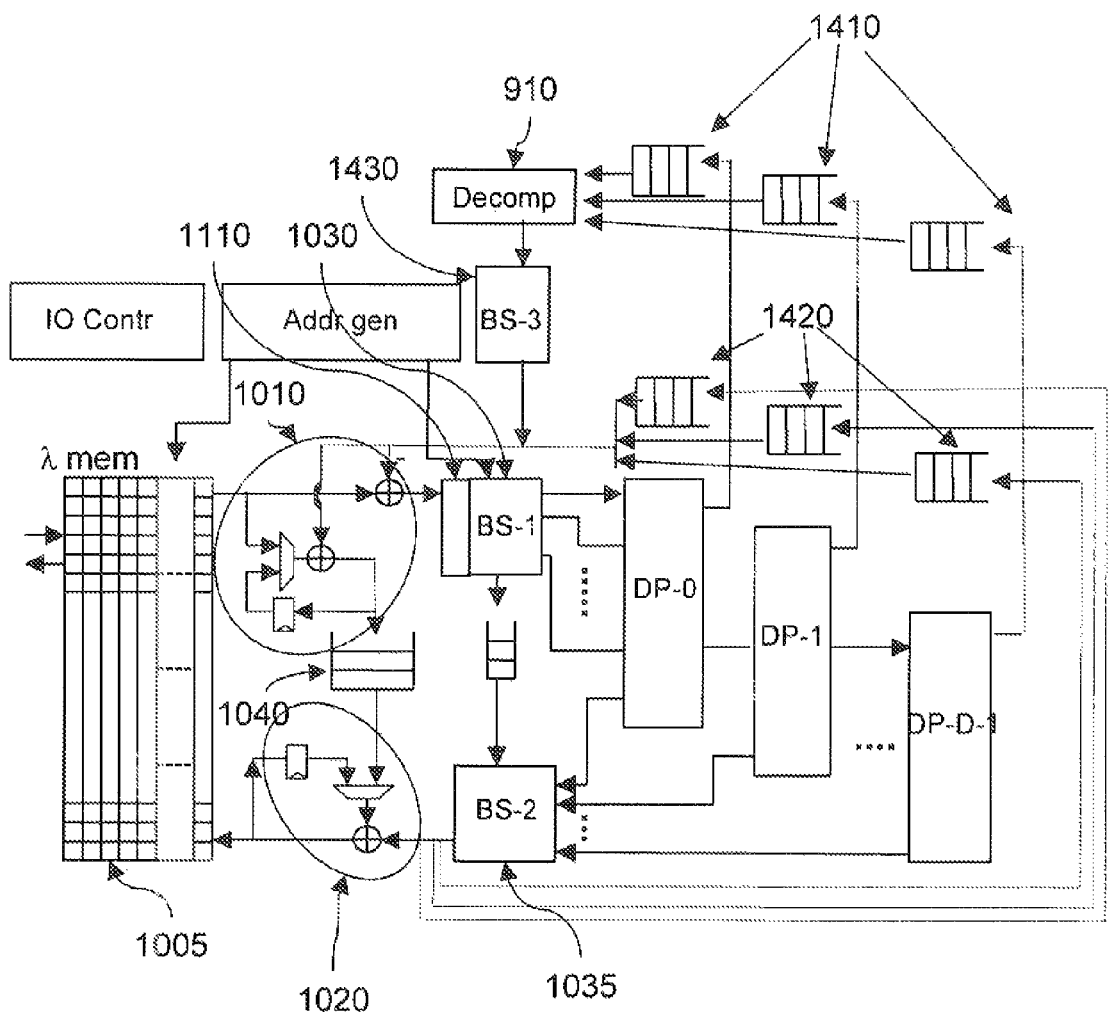
FIG. 14 shows the architecture in combination with compressed Λ storage.

The architectures shown in FIGS. 8, 10, 11 and 13 uses FIFO's for storing the $\Lambda_{mn}$ messages. As argued before, applying compressed Λ storage can save area. For this to be implemented in the architecture according to the invention, as is illustrated in FIG. 14, the sign and magnitude are split. The signs are tapped after the returning barrel shifter 1035 and stored in buffers (preferably FIFOs) 1420. For the magnitudes, the vector from the data path is tapped, as is the case in FIG. 9, and stored in buffers (preferably FIFOs) 1410. The decompress unit 910 is similar as to the one described for FIG. 9. A third barrel shifter 1430 is added performing a same function as barrel shifter 1035.

It will be appreciated that the invention may be implemented in hardware component as well as in software, for example on a Digital Signal Processor (DSP) or optimized VLIW processors. For software implementation, the blocks described in the figures can be seen to represent functional software units. The invention thus also extends to computer programs, particularly computer programs on or in a carrier, adapted for putting the invention into practice. The program may be in the form of source code, object code, a code intermediate source and object code such as partially compiled form, or in any other form suitable for use in the implementation of the method according to the invention. The carrier may be any entity or device capable of carrying the program. For example, the carrier may include a storage medium, such as a ROM, for example a CD ROM or a semiconductor ROM, or a magnetic recording medium, for example a floppy disc or hard disk. Further the carrier may be a transmissible carrier such as an electrical or optical signal, which may be conveyed via electrical or optical cable or by radio or other means. When the program is embodied in such a signal, the carrier may be constituted by such cable or other device or means. Alternatively, the carrier may be an integrated circuit in which the program is embedded, the integrated circuit being adapted for performing, or for use in the performance of, the relevant method.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An LDPC decoder for iteratively decoding an LDPC code on a Galois Field where the code is represented by a predetermined M×N parity check matrix H comprising a plurality of sub-matrices where each sub-matrix is either a zero-matrix or a matrix with a same number of non-zero elements in each row and column; the LDPC decoder being based on a Log-Likelihood Ratio Belief-Propagation algorithm, hereinafter referred to a LLR-BP algorithm, representing passing symbol messages $\lambda_{nm}$ from a respective symbol-node n (0<=n<N) to a connected check-node m (0<=m<M) and passing check node messages $\Lambda_{mn}$ from a respective check-node m to a connected symbol-node n; connections between symbol nodes and check nodes being defined by the parity check matrix H; the LDPC decoder comprising:

a first memory for storing, for each symbol node, a representation of a respective symbol value of a corresponding symbol of the LDPC code;
a second memory for storing a representation of the respective check node messages $\Lambda_{mn}$;
first computation means for computing, for a next iteration, symbol messages $\lambda_{nm}$ from the representation of a corresponding symbol value stored in the first memory and check node messages from a previous iteration;
a shuffler for receiving from the first computation means symbol messages arranged in a first sequence and supplying the symbol message in a different sequence in dependence on a position of non-zero elements in a corresponding sub-matrix;
second computation means (DP-O, DP-I, DP-DI) for computing, in accordance with the LLR-BP algorithm, check node messages and for storing a representation of the computed check node messages in the second memory; the computation being in dependence on symbol messages received from the shuffler by the respective check node; and
third computation means for updating the representation of the symbol values in the first memory in dependence on output of the first and second computing means.

2. An LDPC decoder as claimed in claim 1, wherein at least one of the sub-matrices is a matrix with at least two non-zero elements in each row and column, hereinafter referred to as multi-matrix; the first computation means being arranged to compute symbol messages $\lambda_{nm}^{i}$ that correspond to a multi-matrix in dependence on associated check node messages that each correspond to a respective one of the non-zero elements in the multi-matrix.

3. An LDPC decoder as claimed in claim 2, wherein the first computation means is arranged to iteratively compute symbol messages relating to a single symbol node by in each iteration combining a respective one of the associated check node messages to a computed result.

4. An LDPC decoder as claimed in claim 1, wherein the LLR-BP algorithm is based on a min-sum algorithm and the LDPC decoder including correcting means for multiplying a value of a symbol message by a corrective factor $\alpha$; and saturation means for restricting a value to a predetermined range; the correcting means and saturating means being arranged in between the first computation means and the shuffler.

5. An LDPC decoder as claimed in claim 1, wherein the representation of the symbol messages is stored in the first memory in a predetermined sequence; the LDPC decoder including a further shuffler arranged in between the second computation means and third computation means for supplying check node messages in a sequence corresponding to said predetermined sequence.

6. An LDPC decoder as claimed in claim 1, wherein the LLR-BP algorithm is based on a min-sum algorithm; the second computation means including compression means for compressing check node messages and storing the check node messages in the second memory in a compressed form; and the first computation means including decompression means for decompressing check node messages read from the second memory.

7. An LDPC decoder as claimed in claim 1, wherein the sub-matrix is a circulant, being either a zero-matrix or a diagonal matrix with at least one diagonal and at least one circulants is a diagonal matrix formed by rotating an identity matrix over at least one position; and the shuffler being a barrel shifter for changing the sequence of symbol messages in dependence on the rotation of the circulants.

8. A method of iteratively decoding an LDPC code on a Galois Field where the code is represented by a predetermined M×N parity check matrix H comprising a plurality of sub-matrices where each sub-matrix is either a zero-matrix or a matrix with a same number of non-zero elements in each row and column; the LDPC decoding method being based on a Log-Likelihood Ratio Belief-Propagation algorithm, hereinafter referred to a LLR-BP algorithm, representing passing symbol messages $\lambda_{nm}$ from a respective symbol-node n (0<=n<N) to a connected check-node m (0<=m<M) and passing check node messages $\Lambda_{mn}$ from a respective check-node m to a connected symbol-node n; connections between symbol nodes and check nodes being defined by the parity check matrix H; the LDPC decoding method comprising:

storing, for each symbol node, a representation of a respective symbol value of a corresponding symbol of the LDPC code in a first memory;

storing a representation of the respective check node messages $\Lambda_{mn}$ in a second memory;

performing a first computation including computing, for a next iteration, symbol messages $\lambda_{nm}$ from the representation of a corresponding symbol value stored in the first memory and check node messages from a previous iteration;

performing a shuffling operation by receiving symbol messages produced by the first computation arranged in a first sequence and supplying the symbol message in a different sequence in dependence on a position of the non-zero elements in a corresponding sub-matrix;

performing a second computation including computing, in accordance with the LLR-BP algorithm, check node messages and storing a representation of the computed check node messages in the second memory; the computation being in dependence on symbol messages received from the shuffler by the respective check node; and updating the representation of the symbol values in the first memory in dependence on output of the first and second computation.

* * * * *